United States Patent [19]

Rohr et al.

[11] 3,947,606

[45] Mar. 30, 1976

[54] PROCESS FOR PRODUCING CHEMICAL COMPOUNDS APPLICABLE TO SURFACES IN THE FORM OF THIN LAYERS

[75] Inventors: Franz Rohr, Ober-Abtsteinach; Heinz Holtschmit, Mannheim; Gerhard Siewerth, Speyer, all of Germany

[73] Assignee: BBC Brown Boveri & Company Limited, Baden, Switzerland

[22] Filed: Sept. 4, 1974

[21] Appl. No.: 503,186

[30] Foreign Application Priority Data

Sept. 8, 1973 Germany............................ 2345441

[52] U.S. Cl. .................... 427/50; 219/76; 219/271; 427/248
[51] Int. Cl.² .......................................... C23C 13/00
[58] Field of Search .......... 117/93; 427/12, 50, 248; 219/271, 76; 331/94.5 G

[56] References Cited

UNITED STATES PATENTS 3,639,150  2/1972  Suhara et al. ......................... 117/93

FOREIGN PATENTS OR APPLICATIONS 1,943,118  2/1970  Germany .............................. 427/50
1,947,480  10/1970  Germany .............................. 427/50

*Primary Examiner*—J. H. Newsome
*Attorney, Agent, or Firm*—Pierce, Scheffler & Parker

[57] ABSTRACT

A surface of a work piece is provided with an adherent, thin but uniform, coating layer of a chemical compound by forming the chemical compound by explosive conversion of a substance into a gaseous state and in one working process, and applying the resulting compound to such surface by means of a surge current discharge.

9 Claims, No Drawings

PROCESS FOR PRODUCING CHEMICAL COMPOUNDS APPLICABLE TO SURFACES IN THE FORM OF THIN LAYERS

The invention concerns a process of producing chemical compounds by explosive conversion of a material into a gaseous phase, and to apply the compound so formed to a surface of a base within one working process by means of surge current discharge.

In many and various fields of process application it is necessary to apply thin layers which are wear- and/or corrosion-resistant. Such processes, to be industrially attractive, should allow rapid operations, brief chronological cycles and layers of specific thickness at predetermined tolerances; such layers should be so smooth that there will be no need for subsequent treatment; and, finally, should definitely prevent the formation of clusters or changes.

The trochoidal contact surfaces of the radial cylinders of internal combustion engines provide a typical example for the application of wear-resistant layers on a work piece. Such contact surfaces must meet very stringent requirements as to wear as well as to surface quality.

In order to apply finely distributed material to a carrier, there is known a process involving a chemical operation wherein gaseous or liquid basic materials are conveyed through a converter which contains carrier material together with a finely distributed catalyst. Such carrier material usually consists of porous bodies which are placed in a suitable salt solution with a catalyst in order to be coated, with the catalyst precipitating from the solution. The finer the catalyst material, the greater will be the activity of the catalyst. However, this known process cannot attain the maximum of feasible activity because this always leads to butte-type deposits, i.e. deposits having isolated projecting portions of the catalyst material.

Such butte-type, disadvantageous deposits of catalyst material will also occur in case of catalyst electrodes for thermo-chemical cells with liquid electrolyes. Such electrodes are usually prepared from a porous carrier, forming a frame, into which is imbedded a catalyst material. For example, the carrier material, together with "Raney"-nickel, is pressed to form an electrode, and subsequently is sintered. This is followed by an activating process wherein the aluminum of the Raney-nickel is separated, with the result that the nickel will be present in finely distributed form. However, this activating process is time-consuming and requires strict control because the greater portion of the nickel will also go into solution. This process has the additional disadvantage that it is limited to a narrow field of application.

It is also known (through published German application Ser. No. 1,253,990) to coat a corrosion-resistant metal in such manner that it is exposed first to thermally decomposable, gaseous compounds of these corrosion-resistant metals, and that these adsorbed (or absorbed) compounds are then treated at higher temperatures. In this manner there is generated a coherent protective coating. However, this process is limited to a few metals only,— such as chromium, nickel, copper, titanium,— which have the property of binding gaseous hydrides, halogenides or carbonyl compounds.

It is obvious that the above-discussed, known processes are not particularly suitable to accomplish trochoidal contact surface coatings (the typical example mentioned above). These processes are too slow for the mass-production of such engines, and they do not result in layers of specific thickness at predetermined tolerances.

It is an object of the present invention to develop a process which makes it possible to coat work pieces of any shape and size; to accomplish a uniform coating within a reasonably short period of time; and positively to prevent the formation of clusters.

This and other inventive objects are accomplished according to the invention in such manner that the material to be vaporized consists of at least two chemically different substances, with at least one of the substances being an electric conductor. The compound so produced is then applied to a surface of a work piece by means of surge current discharge, thus attaining a very efficient adhesion to the carrier material and, by the appropriate arrangement of the electrodes or current lead-ins respectively, as well as a uniform coating without cluster formation. The process can be carried out by use of a material component in the solid, liquid or gaseous state.

The invention is based on the realization that it is possible, at the plasma state generated by a surge current discharge, to create chemical compounds or alloys, to be placed with substantial kinetic energy onto a carrier material which is arranged adjacently.

The materials to be vaporized are additionally characterized by the preferred features that the electrically conducting component envelops the other component or components, or else is enveloped by said other component or components. To give a concrete example: a wire is surrounded by a small tube or jacket consisting essentially of the other material component. The electrically conducting component can be formed by an electron or ion conductor. It is also possible to provide, in addition to a component which is electrically conducting at room temperature, at least one other component which is ion-conducting at high temperature only. It is also feasible that the conductor proper represents the chemical reaction component, or that the conductor surrounds the reaction component, or is surrounded by the reaction component.

In further development of the invention, the reaction components are arranged in immediate proximity to the base to be coated by vapor, or the reaction components can form the surface of this base. In practice, this is accomplished for example by using a thin film of polyethylene as the surface, in order to produce carbides. One or more gaseous reaction components can be present within one reaction area.

In order to produce within a very short period of time a layer possessing a particularly efficient adhesive strength, it is further possible to combine the electrically conducting component with a component which consists of an explosive reaction mixture.

The invention offers the following advantages:

Two process steps are accomplished by one surge current discharge. The triggering of a surge current discharge causes a chemical reaction; it accelerates the particles produced by such reaction, thereby securely coupling the nascent particles with the surface to be coated. Duplication is particularly easy to accomplish because the thickness of the coating is proportional to the mass of the conductive material used for vaporization. Uniform coatings will be attained by the appropriate placement of the substance to be vaporized.

The following are typical examples of the process according to this invention:

a. As material to be vaporized there is used titanium wire coated with polyethylene, which substances are converted into TiC by the surge current discharge. The article, so formed, is hurled onto a work piece located nearby, for example a steel bearing, thus making the bearing surface more resistant to wear.

b. Another example uses as basic material copper imbedded in tungsten, which mass is vaporized in the form of pins or wire; the liquid coppermelt droplets are hurled, together with any tungsten particles sweated on the surface, onto the work piece to be coated, for example onto an arc contact piece made of copper. The resulting adherent coating increases the piece's resistance to burning.

c. As vaporizing material there is used a Ti tubule filled with liquid or pasty hydrocarbons. There is formed, similar to Example 1, titanium carbide which can be applied to various work piece surfaces, forming a wear-resistant surface layer.

d. As vaporizable material there is vaporized under an ammonia atmosphere a metal rod which is suitable for the formation of nitrides. The ammonia decomposes within the hot discharge zone, and forms, at least in part, a nitride compound. The nitride deposits in the form of a coating on a suitable base.

SPECIFIC EXAMPLE OF THE PROCESS

The Example $a$ is described below in detail. The Examples $b$ to $d$ can be accomplished similarly.

A bundle of Ti-wires, which are coated with polyethylene, are connected to the terminals of a surge current battery in such manner that the component electric currents are distributed uniformly over the wires. For example, a surge current battery can be used as described in "ETZ" — B Bd. 16 (1964), H. 18, pages 529 to 535. The apparatus is equipped for at least 15 kWsec and for a voltage range of 10 to 40 kV, with the discharge frequency ranging approximately from 20 to 100 kHz. The bundle of wires to be vaporized is concentrically surrounded by a steel sleeve to be interiorly coated. The steel sleeve has a diameter of 30 mm and a length of 100 mm. The entire arrangement is located within a bell-jar which is evacuated to $10^{-3}$ to $10^{-4}$ torr.

A surge current discharge is now generated, with a duration of approximately $4 \times 10^{-5}$ to $2 \times 10^{-4}$ second. The bundle of wires explodes and partially vaporizes at temperatures of several thousand degrees Celsius. The polyethylene splits into carbon and hydrogen, with most of the carbon combining with Ti into Ti-carbide, which latter deposits at high kinetic energy on the surface of the steel sleeve to be coated. The resulting coating of TiC is uniform and very adherent.

In case of the example given, the TiC coating has an approximate thickness of 1 $\mu$m, but it is possible by use of a larger wire bundle, or by repeated coatings, to obtain carbide coatings of 100 $\mu$m and above.

In view of the skin effect, the thickness of the material to be vaporized, or of the wires respectively, should normally not exceed 0.8 to 1 mm.

The term "vaporization" used above does not imply necessarily that the coating material vaporizes to a great extent, or even completely. If materials with a high melting point are being used, there will form either fine molten droplets or small solid particles, which is entirely sufficient to carry out the invention.

If the material to be vaporized and the surface to be coated are arranged properly, uniform and very stable coatings will result.

We claim:

1. Process of forming and applying a layer of a reaction product to a surface of a base, which comprises: bringing together at least two chemically different components, one of which is an electric conductor, and the other is a solid or liquid in imediate contact therewith, in immediate proximity to said base, and explosively forming a reaction product of said components by effecting a surge current discharge through said conductor, thereby generating a plasma state in which said formed reaction product is hurled against the surface of said base.

2. Process according to claim 1, wherein a material component is present in the solid state.

3. Process according to claim 1, wherein a material component is present in the liquid state.

4. Process according to claim 1, wherein the electrically conducting component of the material envelops the other component or components.

5. Process according to claim 1, wherein the electrically conducting component of the material is enveloped by said other component or components.

6. Process according to claim 1, wherein the conductor proper is a chemically reactive component.

7. Process according to claim 1, wherein the reaction components are arranged in immediate proximity to the base to be coated by vapor or form the surface of this base.

8. Process according to claim 1, wherein at least one gaseous reaction component is present within one reaction area.

9. Process according to claim 4, wherein the other component consists of an explosive reaction mixture.

* * * * *